(12) United States Patent
Lounsbury (10) Patent No.: US 10,060,049 B2
(45) Date of Patent: Aug. 28, 2018

(54) METHOD OF MAKING A JOINT BETWEEN SAPPHIRE PARTS

(71) Applicant: Roger Ian Lounsbury, Deep River (CA)

(72) Inventor: Roger Ian Lounsbury, Deep River (CA)

(73) Assignee: Roger Ian Lounsbury, Deep River, Ontario (CA)

( * ) Notice: Subject to any disclaimer, the term of this patent is extended or adjusted under 35 U.S.C. 154(b) by 0 days.

(21) Appl. No.: 15/407,044

(22) Filed: Jan. 16, 2017

(65) Prior Publication Data

US 2017/0121851 A1 May 4, 2017

Related U.S. Application Data (63) Continuation-in-part of application No. 13/830,151, filed on Mar. 14, 2013, now Pat. No. 9,570,202.

(51) Int. Cl.
| | |
|---|---|
| *C30B 29/20* | (2006.01) |
| *C30B 33/06* | (2006.01) |
| *C30B 21/02* | (2006.01) |
| *C30B 29/38* | (2006.01) |
| *G21C 21/02* | (2006.01) |
| *G21C 3/324* | (2006.01) |

(52) U.S. Cl.
CPC ............ *C30B 33/06* (2013.01); *C30B 21/02* (2013.01); *C30B 29/20* (2013.01); *C30B 29/38* (2013.01); *G21C 3/324* (2013.01); *G21C 21/02* (2013.01)

(58) Field of Classification Search
CPC .......... C30B 29/20; C30B 33/00; C30B 33/06
See application file for complete search history.

(56) References Cited

U.S. PATENT DOCUMENTS

2011/0117726 A1* 5/2011 Pinnington ....... H01L 21/02389
438/458

FOREIGN PATENT DOCUMENTS

EP 0993370 A4 11/2001

OTHER PUBLICATIONS

Pells, George Philip, "Radiation Damage Effects in Alumina", AEA Reactor Services, Materials Performance Department, Harwell Laboratory, UK., Published in Journal of the American Ceramic Society, vol. 77, No. 2.

(Continued)

*Primary Examiner* — Robert M Kunemund
(74) *Attorney, Agent, or Firm* — Adrian Zahl; Ridout & Maybee LLP (57) ABSTRACT

A method of making a joint between parts is provided, wherein the surface of at least one of the parts comprises aluminum oxide such as alpha aluminum oxide in the form of sapphire. A layer of aluminum nitride is provided between the surfaces of the parts where these contact. The method comprises the steps of bringing the parts into contact whereby the aluminum nitride layer is sandwiched between the parts and is in contact with the aluminum oxide surface, and performing localized heating of the aluminum nitride. The aluminum nitride is heated to at least the melting temperature of the aluminum nitride aluminum oxide eutectic, such that the aluminum nitride and adjacent aluminum oxide mix and melt to form an aluminum oxy-nitride bond. On cooling, the aluminum oxynitride forms a solid joint between the parts.

28 Claims, 9 Drawing Sheets

(56) References Cited

OTHER PUBLICATIONS

Wilks, R.S., et al., "The Irradiation-Induced Macroscopic Growth of alpha-A1203 Single Crystals", UKAEA Research Group, Ceramics Division, Atomic Energy research Establishment, Harwell, UK, published in Journal of Nuclear Materials 24, (1987) 80-86.
Wachtman, J.B. Jr. et al., "Plastc Deformation of Ceramic-Oxide Single Crystals", National Bureau of Standards, Washington, D.C., Journal of the American Ceramic Society, vol. 37, No. 7 Jul. 1, 1954.
Gooch, D.J. et al., "The Creep of Sapphire Filament with Orientations Close to the c-axis", Department of Metallurgy, University, of Oxford, UK, published in Journal of Materials and Science (1973) 1238-1246.
Firestone, R.F. et al., "Creep Deformation of 0 Sapphire", Department of Metallurgy and Materials Science, Case Western Reserve University, Cleveland, Ohio 44106, published in Journal of the American Ceramic Society, vol. 59, No. 1-2
Harris, Daniel, et al., "Factors that Influence Mechanical Failure of Sapphire at High Temperature", Proceedings SPIE, 3060 (1997).
Kotchick, D.M. et al., "Deformation Behavior of Sapphire via the Prismatic Slip System", Department of Materials Science and Engineering, The Pennsylvania State University, University Park Pennsylvania, published in Journal of the American Ceramic Society, vol. 63, No. 7-8.
"Properties and Benefits of Sapphire: A Quick Reference Guide", Saint-Gobain Crystals.
"Saphikon EFG Sapphire", Saint-Gobain Crystals.
"EFG Sapphire Tubes", Saint-Gobain Crystals.
Nagae, Masahiro et al., "Corrosion Behavior of Structural Ceramics in Surpercritical Water", published in Advanced Science and Technology, vol. 45 (2006) pp. 173-177.
Regan, Thomas M. et al., "Neutron Irradiation of Sapphire for Compressive Strengthening II. Physical Properties Changes", published in Journal of Nuclear Materials 300 (2002) 47-50.
Goto, Takayasu et al., "Elastic Constants of Corundum up to 1825 K", published in Journal of Geophysical Research, vol. 98, No. B6, pp. 7588-7602, Jun. 10, 1989.
Qiu et al., "Phase Relations in the Aluminum Carbide-Aluminum Nitride-Aluminum Oxide System", published in the Journal of the American Ceramic Society, vol. 80, No. 8 2013-2020 (1997).
McCauley, J.W., "Structure and Properties of Aluminum Nitride and AION Ceramics", Weapons and Materials Research Directorate, Army Research Laboratory, May 2002.
Corbin, N.D., "Aluminum Oxynitride Spinel (ALON): A Review", Materials Characterization Division, U.S. Army Materials Technology Laboratory, Jul. 1987.
Fiore, D.F., "High Strength Diffusion Bonding of Sapphire", Department of Material Science and Engineering, Faculty of Worcester Polytechnic Institute, Aug. 2002.
Walker, C.A. et al., "Direct Brazing of Sapphire to Niobium", Sandia National Laboratories, New Mexico, published in Brazing and Soldering Today, Welding Journal (Mar. 2010) 50-55.
Kasch, S. et al., "High Temperature Joining of Ceramics and Sapphire by Laser-based Process", published in Journal of Ceramic Science and Technology, vol. 5, No. 4, 269-274 (2014).
Kim, Y.W. et al., "Reaction Sintering and Microstructural Development in the System Al2O3—AlN", Research Institute of Industrial Science and Technology, Division of Materials Science and Engineering, Pusan National University, South Korea, published in Journal of the European Ceramic Society 21 (2001) 2383-2391.
Zeng, L. et al., "The Interfacial Microstructure of Joined Single Crystal and Polycrystalline Alumina", Department of Chemical Engineering and Materials Science, Michigan State University, published in Materials Science and Engineering A360 (2003) 228-236.
Ning H. et al., "Joining of Sapphire and Hot Pressed Al2O3 using Ag70.5Cu27.5Tl2 Brazing Filler Metal", Department of Materials Science and Engineering, Tsinghua University, published in Ceramics International 29 (2003) 689-694.

* cited by examiner

Figure 9

METHOD OF MAKING A JOINT BETWEEN SAPPHIRE PARTS

CROSS REFERENCE TO RELATED APPLICATIONS

This application is a continuation-in-part of application Ser. No. 13/830,151 filed Mar. 14, 2013 now U.S. Pat. No. 9,570,202. The contents of said application are incorporated herein by reference.

This application is related to application Ser. No. 13/829,812 filed concurrently herewith on Mar. 14, 2013, the contents of which are incorporated herein by reference.

FIELD

This invention relates to industrial methods for joining together components of a product, in which at least one of the components is fabricated from sapphire or other form of aluminum oxide. In one aspect, the invention relates to methods of fabricating sapphire components of nuclear reactor fuel elements.

BACKGROUND

Conventionally, nuclear reactors comprise pressure tubes or pressure vessels, though nuclear reactors that have both pressure tubes and a pressure vessel have been disclosed.

At present, nuclear power plant safety is of particular concern in the aftermath of the Fukushima accident in Japan in 2011 and others in which the fuel becomes exposed after the reactor has shut down. Some proposals for improving safety have focused upon prolonging the time to catastrophic failure in a severe accident in which decay heat may cause either or both of fuel cladding failure and hydrogen production. One option is to provide passive decay heat removal following a severe accident, but this requires the fuel cladding to be capable of retaining the fuel fission products while the decay heat is transferred from the fuel, predominantly by thermal radiation.

Although improving safety is of paramount importance, it is desirable to do so without reducing efficiency. In fact, there is an ongoing desire to improve the efficiency of nuclear reactor power plants without prejudice to their safety. Improved efficiency can be obtained by increasing operating temperatures. To this end, it has been proposed to build nuclear power reactors employing supercritical water which requires much higher operating pressures than the current art PWR, BWR and PHWR. A fuel must be capable of operating at the temperature and pressure of supercritical water, and withstanding the corrosive environment of irradiated supercritical water and radiation damage. The fuel cladding must also have acceptably low neutron absorption to function economically while desirably providing for passive decay heat removal following a severe accident in which the fuel becomes exposed after the reactor has shut down.

It is known to use supercritical water systems in fossil fuel power stations. However, the technologies, particularly materials, used in supercritical fossil fuel stations cannot necessarily be used in supercritical nuclear reactor stations where low neutron absorption and corrosion resistance at supercritical temperatures and radiation levels are particularly important. This is especially so for the fuels and the fuel assemblies containing them.

It is known, for example, to use stainless steel to clad fuel for a higher temperature operation. It is unlikely that, in severe accident conditions, this fuel cladding would have been capable of retaining fission products while passively transferring decay heat in a PHWR, PWR or BWR. In particular, under severe accident conditions, the temperature will become high enough to cause the conventional fuel cladding to oxidize and eventually melt, leading to hydrogen production and release of fission products.

Other steels, nickel and titanium-based alloys that have been studied for supercritical water reactor use also have relatively high neutron absorption and entail the use of enriched uranium. They would not be entirely suitable for use in applying similar reactor physics when refitting an existing reactor, for example a PHWR.

In his concurrently-filed patent application Ser. No. 13/829,812, the present inventor discloses fuel elements in which the fuel pellets are housed in a cladding tube made of sapphire. It is known to make sapphire tubes by growing the sapphire using edge defined film fed growth and using a die to form it into a tube. Although sapphire tubes made in this way may be satisfactory for general application, they would be of limited use as cladding in nuclear reactor fuel elements because their inner surfaces, as initially manufactured, have ridges that limit thermal contact between the fuel pellets and the cladding tube.

While it might be possible to grind the inner surfaces of the sapphire tubes to obtain a required smoothness for cladding, grinding would require very hard, for example diamond, grinding tools and be very time-consuming to obtain required cladding and component dimensions. Consequently, it may not be economical and commercially viable at this time.

The use of sapphire-clad components in a reactor, as well as other applications, can require that such components be joined together with a robust joint that withstands extreme conditions such as high temperatures. Consequently, there is a need for improved methods for making such joints between parts of a component, in which the component comprises sapphire or other form of aluminum oxide.

SUMMARY OF INVENTION

The present inventor sought to mitigate the limitations of known methods of fabricating and assembling sapphire tubes and associated components, especially for nuclear reactor fuel elements, or at least provide an alternative.

According to one aspect, I disclose herein a method of forming a joint between contacting surfaces of parts, wherein the at least one of the parts comprises aluminum oxide. Suitable forms of aluminum oxide include structurally useful forms, such as sapphire. The sapphire may comprise single crystal sapphire.

A joint-forming layer is provided between the respective parts, composed of a compound such as aluminum nitride that will produce a joint forming mixture with the abutting aluminum oxide when heated. The method comprises bringing the parts into contact whereby the joint-forming layer contacts the surfaces of the respective parts. The joint-forming layer is selectively heated to a temperature whereby the aluminum nitride (or other joint-forming mixture) reacts with the aluminum oxide of the parts. The selective heating consists of locally heating the joint forming compound from a heat source which does not directly heat the aluminum oxide. The temperature-driven reaction between the respective compounds forms aluminum oxy-nitride compounds that, on cooling, join the parts. In this fashion, the parts are monolithically joined by intermixing and chemical reaction whereby a border region at the junction between the parts, and extending into the respective parts, comprises a monolithic composition of aluminum oxide and aluminum oxynitride. The joint forming layer may be heated to exceed the lowest temperature eutectic of the joint forming mixture (i.e. the temperature at which the respective aluminum compounds react to form a eutectic mixture). The joint forming layer selectively absorbs the applied heat whilst the adjacent parts are transparent to the applied heat. As result, the adjacent parts are heated solely by indirect means, such as conduction from the heated joint-forming layer.

Optionally, an additional layer may be provided between the parts, comprising a eutectic compound that melts, mixes and reacts with the adjoining parts and also the joint-forming layer when heated, to join the respective parts. This additional layer is not directly heated by the heat source. The heat to drive the reaction between the parts, the joint-forming layer and the second layer is generated solely by the joint-forming layer absorbing heat from the heat source and then conducting this heat to the other layers.

The joint forming layer may continue to absorb heat from the heat source until it is fully reacted, at which time it becomes transparent to the radiated heat and the parts then cool.

The localized, selective heating of the joint-forming layer may be provided by exposing this layer to infrared illumination from a heat source such as a laser beam directed through one or both of the sapphire parts whereby the joint-forming layer absorbs infrared radiation, until it is reacted with the adjoining parts. The parts are transparent to the IR radiation and thus do not absorb any substantial amount of the IR radiation. The IR beam thus passes through at least one of the parts to reach the joint-forming layer, causing selective heating of this layer and consequently, indirect heating of a region of the parts in direct contact therewith.

The laser may comprise, for example, a neodymium-doped yttrium aluminum garnet (Nd:YAG) diode laser or a fiber laser, preferably with a wavelength of about 1 micrometer.

The method may further comprise the step of providing the joint-forming layer by coating or layering at least one of the parts with a layer of aluminum nitride such as by adhering a wafer of aluminum nitride to one of the parts where this contacts the opposing part.

At least one of the parts may comprise solid sapphire whereby the localized heating comprises directing an energy beam such as a laser beam through the part to contact the aluminum nitride layer.

According to one aspect I disclose a method of making a joint between sapphire parts by:
  providing at a joint interface between juxtaposed surfaces of the parts an infrared absorbing interstitial layer of aluminum nitride, and
  locally heating the layer by infrared illumination to the melting temperature of the juxtaposed surfaces of the sapphire parts, such that the aluminium nitride react with the aluminum nitride layer of a juxtaposed sapphire layer within the parts to form aluminum oxynitride compounds that, on cooling, provide required joining of the parts through a monolithic layer of aluminum oxide and aluminum oxynitride compounds.

I also disclose herein a method of surface finishing a cladding tube for a fuel element of a nuclear reactor core in which the cladding tube contains a plurality of fuel pellets, the method comprising the steps of:
  taking a sapphire tube,
  heating the tube to thermal creep temperatures (e.g., 1750-2000 degrees Celsius);
  slowly drawing and/or pushing the heated tube through a plug and die set to reduce heights of ridges on respective inner and outer surfaces of the tube while limiting changes in the crystalline structure, especially the crystal orientation, of the bulk of the tube.

The plug and die set may be dimensioned to provide substantially uniform wall thickness of the tube while reducing ridge height and limiting changes in the crystalline structure, especially the crystal orientation, of the bulk of the tube.

The forming may displace ridge material by producing shear along an "a" plane parallel to a principal "c" axis of the tube material.

The tube may be drawn or pushed in a similar manner through one or more additional plug and die sets having slightly larger inner diameters and slightly smaller outer diameters, respectively, so as to reduce ridge height in successive steps. A final plug and die then may have respective inner and outer diameters corresponding to finished outer and inner diameters of the tube.

After drawing by a first die, the tube may be allowed to thermally soak at a temperature slightly above the drawing temperature to alleviate work-hardening before being drawn by the next die so that the ridges remain workable during such drawing by the next die.

I also disclose a method of thermal creep differential expansion moulding of a sapphire tube using a mould that is made of a material that has a different coefficient of expansion than sapphire and is non-wettable by sapphire, the mould being sized and shaped to give desired diameters and surface uniformity of at least one of inner and outer surfaces of the tube, the method comprising: placing the rough sapphire tube in the mould and slowly heating the tube-mould assembly to the range of the creep temperature of the sapphire and causing pressure at an interface between the sapphire and the mould;
  maintaining the assembly at the upper end of the creep temperature range for a creep and soak period to allow creep to progress and relieve the stresses from the pressure upon the sapphire tube from the mould; and
  slowly cooling the assembly, allowing the sapphire tube to part from the mould so that it can be withdrawn.

The mould may be adapted to apply pressure to form the inner surface or the outer surface of the sapphire, or both surfaces at the same time.

In a nuclear reactor core, the transfer of heat from the fuel to the cladding depends upon the smoothness of the inner surface of the cladding which determines the thermal contact between the fuel and the cladding. Uniformity of thickness of the cladding is desirable to equally distribute stress and strains resulting from coolant pressure external to the cladding and helium fill gas, fission product gas and fuel pellet contact pressure internal to the cladding.

Once formed and provided with fuel pellets, the tube may be closed off at each end with an end cap to form a fuel element. A plurality of these fuel elements may be assembled together with spacers and/or grid-like supports to form a so-called fuel bundle. These end caps and spacers and/or grids may be of the same material as the tube and finished by grinding in known manner. However, it may be desirable to form them using a method disclosed herein suitably adapted.

In this industry, a variety of terms are used for the pressure barrier between the fuel and the reactor coolant. For convenience, in the context of this specification, the term "cladding" will be used for such pressure barrier, whether in a pressure-tube or pressure-vessel type of reactor.

The term "fuel elements" will be used to embrace both the fuel elements of a pressure-tube type of reactor and the fuel rods of a pressure-vessel type of reactor.

The term "fuel assembly" refers to a plurality of fuel elements which are held together in parallel. In the case of a PHWR, this fuel assembly usually is called a "fuel bundle".

The term "fuel channel" refers to an assembly of components in a pressure tube type reactor comprising the pressure tube and other components that maintain and provide insulation between the reactor coolant and moderator outside the pressure tube.

The term "joint forming mixture" as used herein refers to solid mix of atomic and/or chemical species of aluminum oxygen and nitrogen, to form a joint In one example, a joint forming mixture refers to a mixture in the AlON—$Al_2O_3$ section of the ALN—$Al_2O_3$ phase diagram.

The term "phase" as used herein refers to a phase in the aluminum oxide-aluminum nitride phase diagram.

The term "eutectic" means the composition ratio where the melting temperature of an aluminum oxide aluminum nitride phase reaches a local minimum on the aluminum oxide aluminum nitride phase diagram.

The term "eutectic mixture" means a mixture of aluminum oxide and aluminum nitride that results in a phase with a lower melting temperature than sapphire.

BRIEF DESCRIPTION OF DRAWINGS

Various objects, features, aspects and advantages of the present invention will become more apparent from the following detailed description of embodiments of the invention, which is provided by way of example only.

DESCRIPTION OF SPECIFIC EMBODIMENTS

Figure 1:
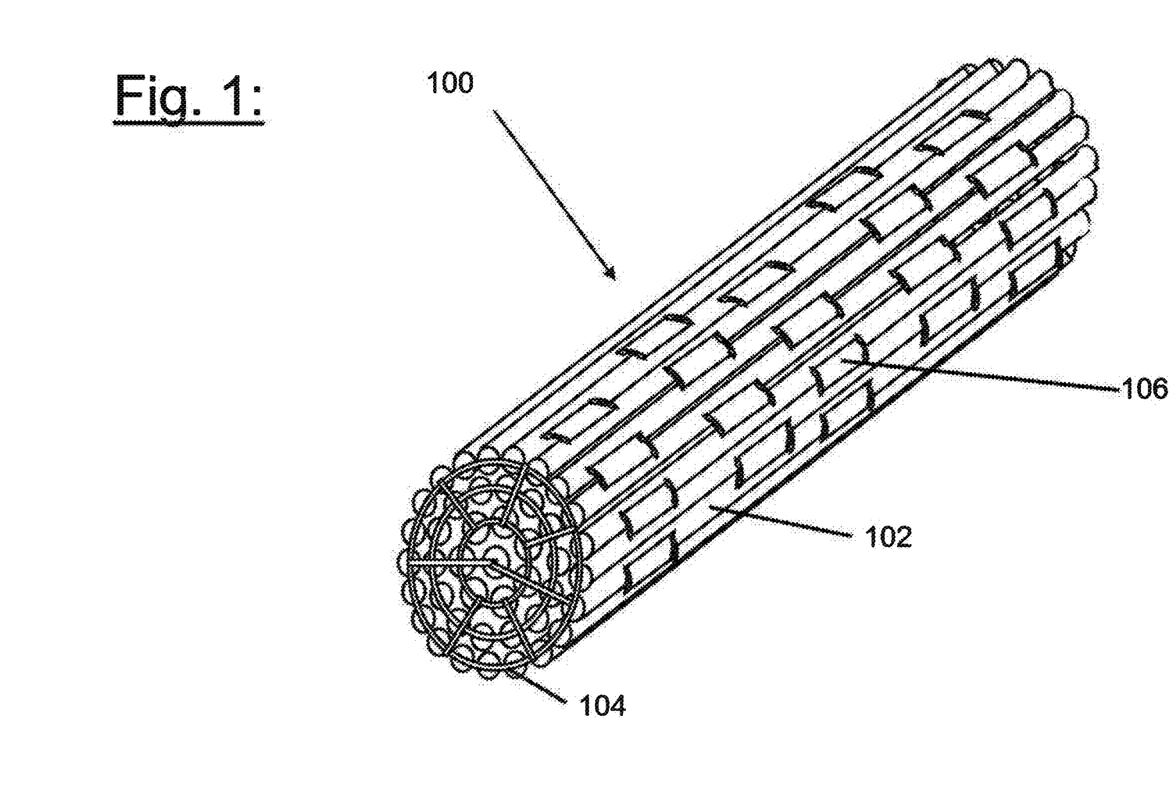
FIG. 1 is a perspective view of a bundle of PHWR fuel elements each comprising a sapphire tube housing a plurality of fuel pellets.

The drawings identify the components of nuclear reactor fuel element and fuel assembly disclosed in the above-identified concurrently-filed application Ser. No. 13/830,151 filed Mar. 14, 2013, that may be manufactured using one or more of the methods disclosed herein. Referring to FIG. 1, a fuel assembly 100 comprises a bundle of fuel elements 102 connected together with/by a pair of end plates 104.

Figures 2, 2A:
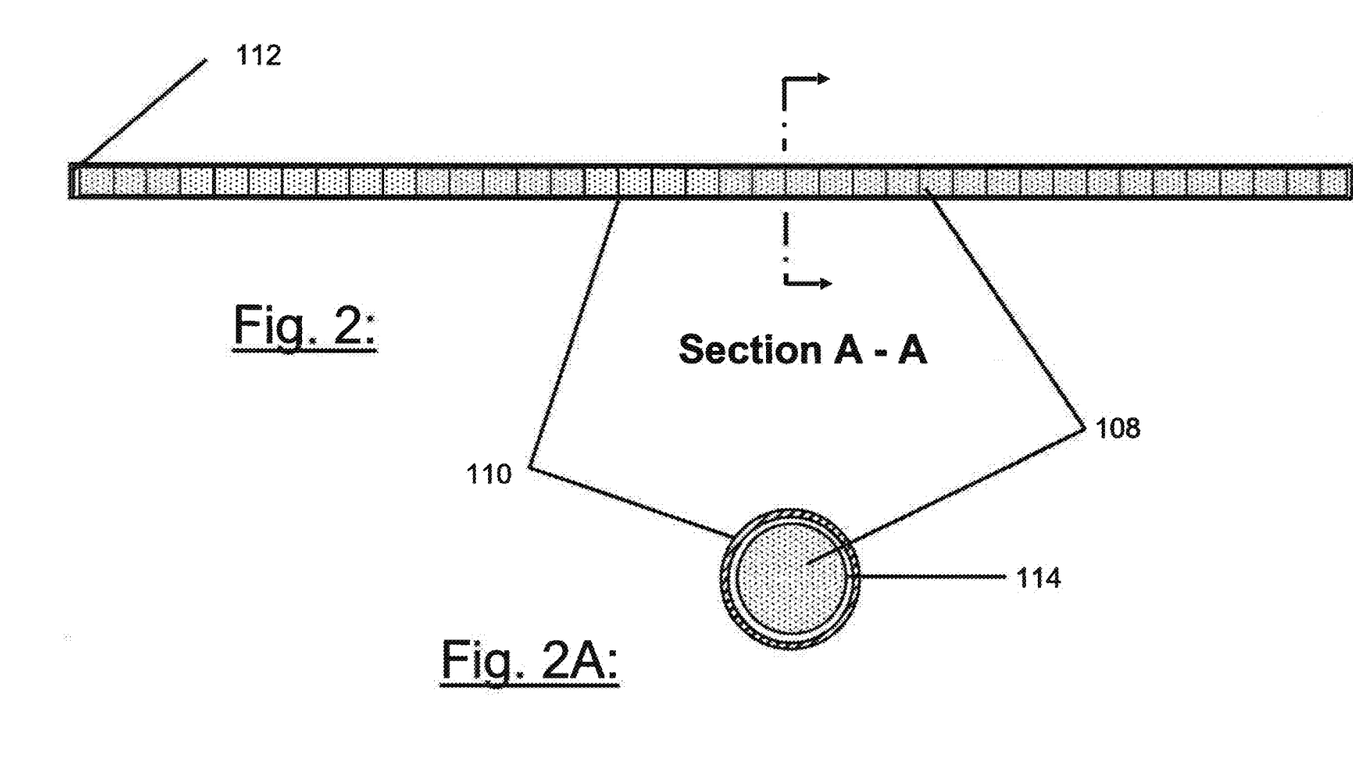
FIG. 2 is a cross-sectional view of one of the PHWR fuel elements.
FIG. 2A is a cross-sectional view taken on the line A-A of FIG. 2.

Referring also to FIGS. 2 and 2A, each of the fuel elements 102 shown in FIG. 1 comprises a plurality of fuel pellets 108 concatenated in cladding 110 in the form of a tube closed at each end by an end cap 112. The cladding 110 and end caps 112 are made of an inert material that is substantially transparent to infrared radiation, specifically sapphire. FIG. 1 also shows a plurality of part-cylindrical tabs 106 distributed around the outwardly-facing surfaces of the outermost ones of the fuel elements 102. Each of these tabs 106 has a larger contact area than a typical bearing pad so that, in comparison, the contact pressure would be reduced. The tabs 106 also are made of sapphire, for example single crystal sapphire. Hence, the tabs 106 can be envisioned as "windows" that are transparent to thermal radiation. It will be appreciated that it would be convenient to use the same material for the tabs 106, cladding 110 and end caps 112, especially single crystal sapphire.

Single crystal sapphire may be preferred because of one or several of a range of properties. Examples include good thermal radiation transmission characteristics, inertness to corrosion in irradiated, high temperature (and even supercritical) water, high melting temperature (greater than 2000° C.), low neutron absorption comparable to existing cladding materials), desirable mechanical characteristics under neutron radiation under a wide range of temperatures, and thermal and mechanical strain characteristics compatible with those of uranium dioxide (fuel). Moreover, single crystal sapphire does not deteriorate under prolonged irradiation, unlike polycrystalline sapphire which deteriorates mechanically due to the anisotropic irradiation growth of the crystals.

Figure 3:
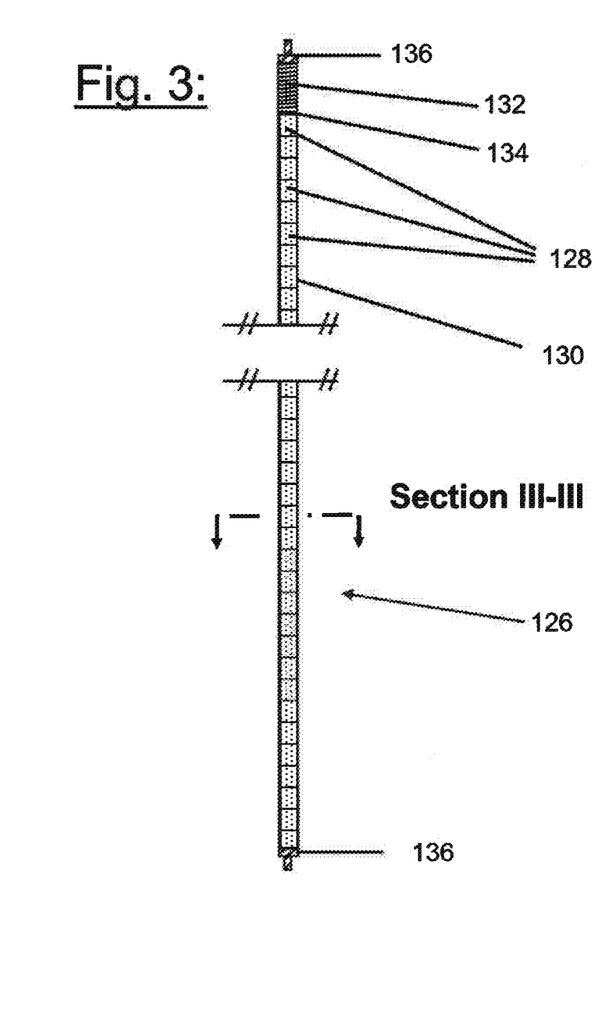
FIG. 3 is a cross-sectional view of a BWR fuel element.
Figure 3A:
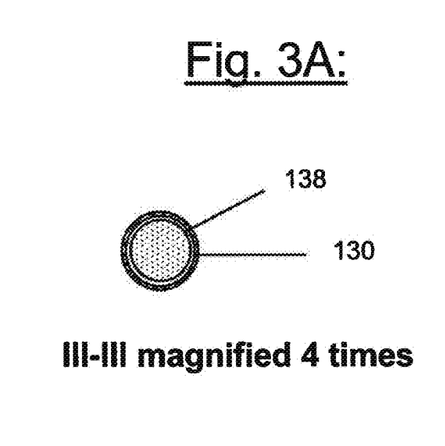
FIG. 3A is a cross-sectional view taken on the line A-A of FIG. 3.

As can be seen from FIG. 2A, which shows, magnified, a cross-section through one of the fuel elements 102 of FIG. 2, when the fuel element 102 first is manufactured, there is a small difference in diameter between the inner surface of the cladding 110 and the exterior of the fuel pellet 108, leaving an annular cylindrical space 114 around the concatenated pellets 108. This space is filled with pressurized helium. While FIGS. 2 and 2A were for a PHWR, FIGS. 3 and 3A show a fuel element 126 for a BWR fuel assembly, comprising a plurality of fuel pellets 128 concatenated in cladding 130 in the form of a tube. The fuel pellets 128 are held tightly together end to end by a spring 132 applying force to a spacer 134 in contact with the endmost fuel pellet. The cladding tube 130 is closed at each end by an end cap 136.

As was the case with the PHWR fuel element of FIGS. 2 and 2A, the cladding 130 and end caps 136 of the BWR fuel elements in FIG. 3 are made of single crystal sapphire.

As before, the desirable properties of single crystal sapphire make it preferred for the fuel element of the BWR.

As can be seen from FIG. 3A, there is a small difference in diameter between the inner of the cladding 130 and the outer of the fuel pellet 128, leaving an annular cylindrical space 138 around the concatenated pellets 128; similarly to FIG. 2A. This space is filled with pressurized helium.

It should be appreciated that a PWR fuel element can be manufactured using similar materials to the BWR fuel element 126 shown in FIGS. 3 and 3A, the principal differences being the use of different fuel pellets and slightly different dimensions of the fuel element components.

The sapphire components of the above-described fuel elements and fuel assembly in FIGS. 1, 2, 2A, 3 and 3A are made of single crystal sapphire using edge defined film fed growth methods to produce roughed out and blank components. The rough sapphire components may have ridges, variability and roughness that make them unsuitable for their nuclear component application. This is especially the case for the cladding tubes.

To eliminate the ridges, roughness and variability, the tubes will be high temperature fine formed to produce a tube having uniform internal diameter and uniform wall thickness. This forming will make use of the high temperature creep properties of sapphire that result in it slowly deforming at temperatures around 1700° C. to 2000° C. under sustained high pressure or load. Either or both of two thermal forming processes may be used, namely "thermal creep drawing" and/or "thermal differential expansion moulding".

Thermal creep drawing and thermal creep differential expansion moulding methods embodying the present invention differ from conventional tube forming processes in that forming occurs at very high temperatures and relies on the thermal creep properties of an otherwise non-ductile material, sapphire, to achieve the desired part shape.

Thermal Creep Drawing

Thermal creep drawing may be used for fine forming the cladding tubes 110. Thus:

Step 1 is to heat the rough sapphire tube up to the creep temperature of 1700° C. to 2000° C.

In step 2, the rough sapphire tube is then slowly drawn and/or pushed through a plug and die set to reduce the ridging and irregularities on the inner and outer surfaces of the roughed tube.

In optional step 3 the tube is allowed to thermally soak at a temperature slightly above the drawing temperature to relieve any work hardening that may have occurred during the drawing process.

In step 4, the tube from step 2 or optional step 3 is drawn or pushed through another plug and die set having slightly tighter internal external diameters to reduce the tube thickness and further reduce ridging and non-uniformities.

Steps 2, 3 (as appropriate) and 4 are repeated at successively tighter plug and die sizes until the desired cladding tube finish and hot dimensions are achieved.

Step 5 is a final hot soak to remove any internal stresses from the forming operation.

Step 6 is a slow cooling of the tube to room temperature where its final dimensions and surface uniformity are confirmed by measurement.

The moulding of inner and outer surface may be interspersed, but the last step would be moulding of the inner surface.

Thermal Creep Differential Moulding

Thermal creep differential expansion moulding requires a mould that is made of a material that has a different coefficient of expansion than sapphire and is non-wettable by sapphire. The mould is sized and shaped to give the desired diameters and surface uniformity of the cladding tube when heated to the sapphire creep temperature range of 1700° C. to 2000° C. The internal diameter dimension and surface uniformity are the most critical to fuel element performance, so the exterior of the rough cladding tube is moulded before the internal diameter which therefore is the last step.

Step 1 is to place the rough sapphire tube in the external diameter mould having a lower thermal coefficient of expansion than sapphire, and slowly heat the tube mould assembly to the creep temperature range.

Step 2 is to hold the assembly at the upper end of the creep temperature range for a creep and soak period to allow creep to progress and relieve the stresses from the compression of the sapphire tube by the mould.

Step 3 is to slowly cool the assembly, allowing the sapphire tube to shrink from the mould such that it can be withdrawn at room temperature.

Steps 1, 2 and 3 can be repeated successively with tighter dimension moulds until the cladding tube achieves the desired outer diameter and surface uniformity.

Step 4 is to place the rough sapphire tube in the internal diameter mould, having a higher thermal coefficient of heating than sapphire, and slowly heat the tube mould assembly to the creep temperature range.

Step 5 is to hold the assembly at the upper end of the creep temperature range for a creep and soak period to allow creep to progress and relieve the stresses from the compression of the sapphire tube by the mould.

Step 6 is to slowly cool the assembly, allowing the mould to shrink from the sapphire tube such that is can be withdrawn at room temperature.

Steps 4, 5 and 6 can be repeated with tighter dimension moulds until the cladding tube achieves the desired inner diameter and surface uniformity.

As in the case of thermal creep drawing described above, forming of the inner and outer surfaces may be interspersed, but the final step will be forming of the inner 25 surface.

The mould may be adapted to apply pressure to form the inner surface or the outer surface of the sapphire, or both surfaces at the same time.

The cladding tubes 110 are subject to the thermal fine forming processes to obtain tight tolerances on the internal diameter and wall thickness. The cladding end caps 112 may be cut from bar stock of ground rods. The endplates 104 may be cut from ground and polished blanks of sheet material. The tabs 106 may be thermally fine formed and/or ground to obtain a smooth bearing surface which, once the fuel assembly is installed in a fuel channel, abuts the inner surface of the fuel channel.

The method of assembly is the same for both of the fuel elements shown in FIGS. 2 and 3, so the assembly will be described using the reference numbers of that shown in FIG. 2.

The fuel elements 102 are assembled by inserting a row of fuel pellets 108 into a cladding tube 110 that is heated to a temperature that allows easy insertion. The pellets 108 are positioned such that there is a controlled distance between the last pellets in the row and the ends of the cladding tube 110. The cladding tube 110 is allowed to cool such that its temperature equalizes with the temperature of the fuel.

The end caps may each comprise a plug (not shown) that inserts into the end of the cladding tube and a rim which has the same diameter as the outer diameter of the cladding tube and abuts the respective end of the cladding tube. (Optionally the end cap may comprise a plug without a rim, or even a flat plate, though the latter is least preferred.) The surfaces of the plugs and rims which will contact the cladding interior and ends, respectively, are coated with a thin layer of aluminum nitride. The end cap is cooled and/or the cladding tube (containing the fuel pellets) is heated to facilitate the insertion of the plugs of the end caps 112 into the cladding tubes 110 while maintaining a controlled gap between the last fuel pellet and the inwardly-facing surface of the end cap 112. The assembly then is allowed to cool or heat, as the case may be, to ambient.

A localized infrared heat source, such as a laser, is used to illuminate and heat the aluminum nitride preferentially until its temperature exceeds the melting temperature of sapphire, which then melts the abutting sapphire surfaces. The molten aluminum nitride and sapphire mix forms an aluminum oxy-nitride bond. The source of infrared heating is removed and the bond is allowed to cool and solidify forming a solid joint between the cladding tube and end cap. The resulting assembly is a single fuel element 102.

The spacing between the fuel elements in a fuel bundle assembly can be maintained by spacer pads attached to the fuel element cladding tube 110. The spacer pads would be made from edge defined film fed growth sapphire rod that is cut to the required thickness of the spacer. The face of the spacer that is to be attached to the cladding tube would be coated with aluminum nitride. The spacer would be joined to the cladding tube using the same infrared heating method as used to join the end caps to the cladding tube.

A fuel bundle 100 is made by assembling the desired number and size of fuel elements 102 in a fixture that sets the fuel bundle geometry.

End plates 104 which hold the bundle of fuel elements 102 are coated with aluminum nitride on one face and the end plate is placed in the assembly fixture such that the aluminum nitride coated face abuts each of the fuel element end caps. A localized infrared heat source such as a laser is used to illuminate and heat each of the aluminum nitride coated end plates at its interface with respective fuel element end caps. The heating progresses until the aluminum nitride coated surfaces of the end plate and contacting fuel element end cap surface begin to melt. The molten aluminum nitride and sapphire mix forms an aluminum oxy-nitride bond. The source of infrared heating is removed and the bond is allowed to cool and solidify forming a solid joint between the end plate and fuel element end caps.

The last step in fuel bundle 100 assembly is to join the tabs 106 to the outer ring of elements 102. The tabs are made from edge defined film fed growth sapphire grown in a cylindrical shell segment form. The tabs are placed at intervals as illustrated in FIG. 1. The tabs are joined with the outer ring of fuel elements using the infrared heating process described for joining the end caps to the cladding tubes. The aluminum nitride required for the infrared absorption and bond is applied to the joint location on the outer elements. Once all of the tabs have been attached, their respective outer surfaces are ground and polished to produce a smooth and accurate outer diameter profile for the bundle.

Figure 4:
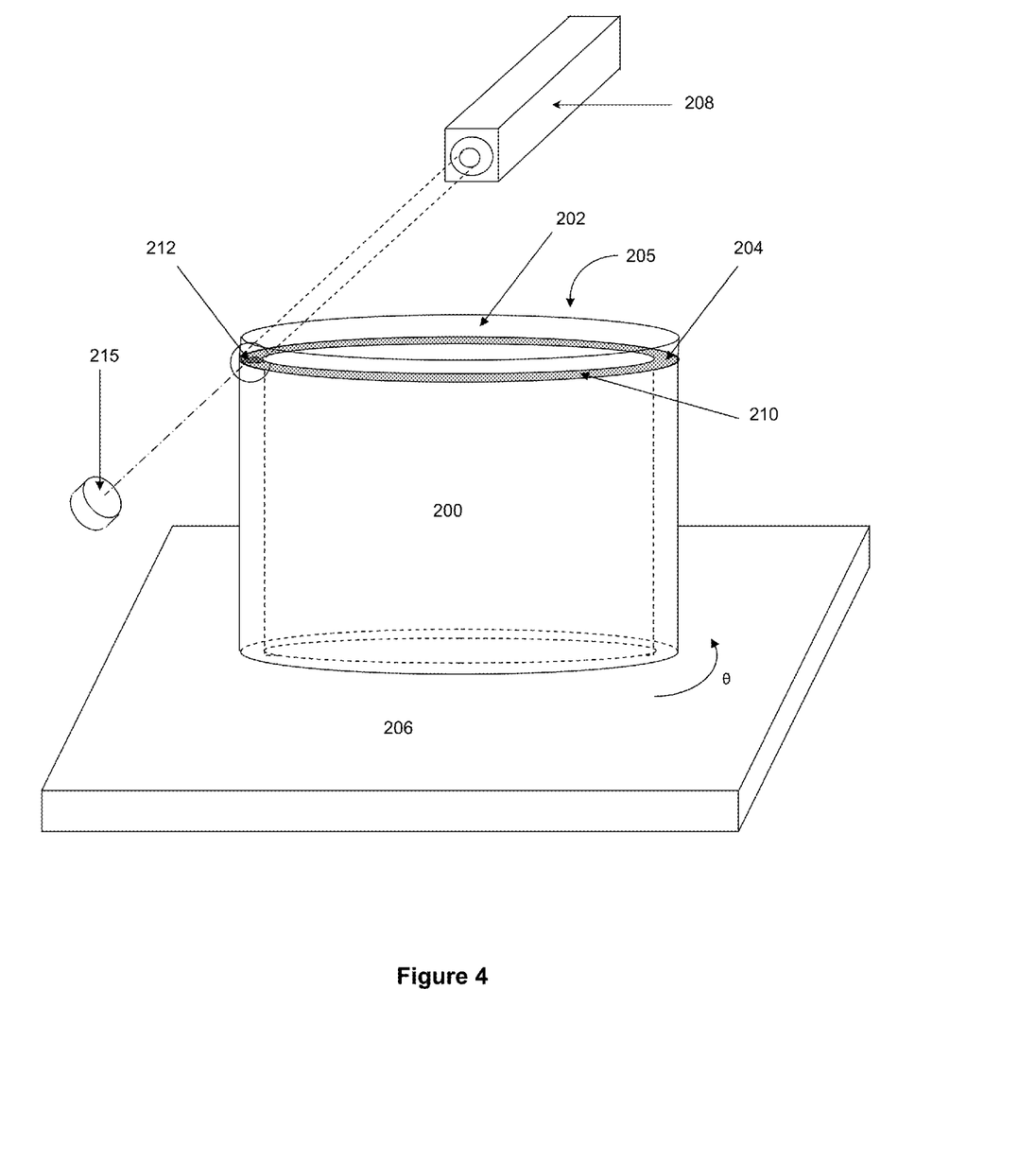
FIG. 4 is a schematic illustration of a method of joining parts according to a further embodiment.
Figure 7:
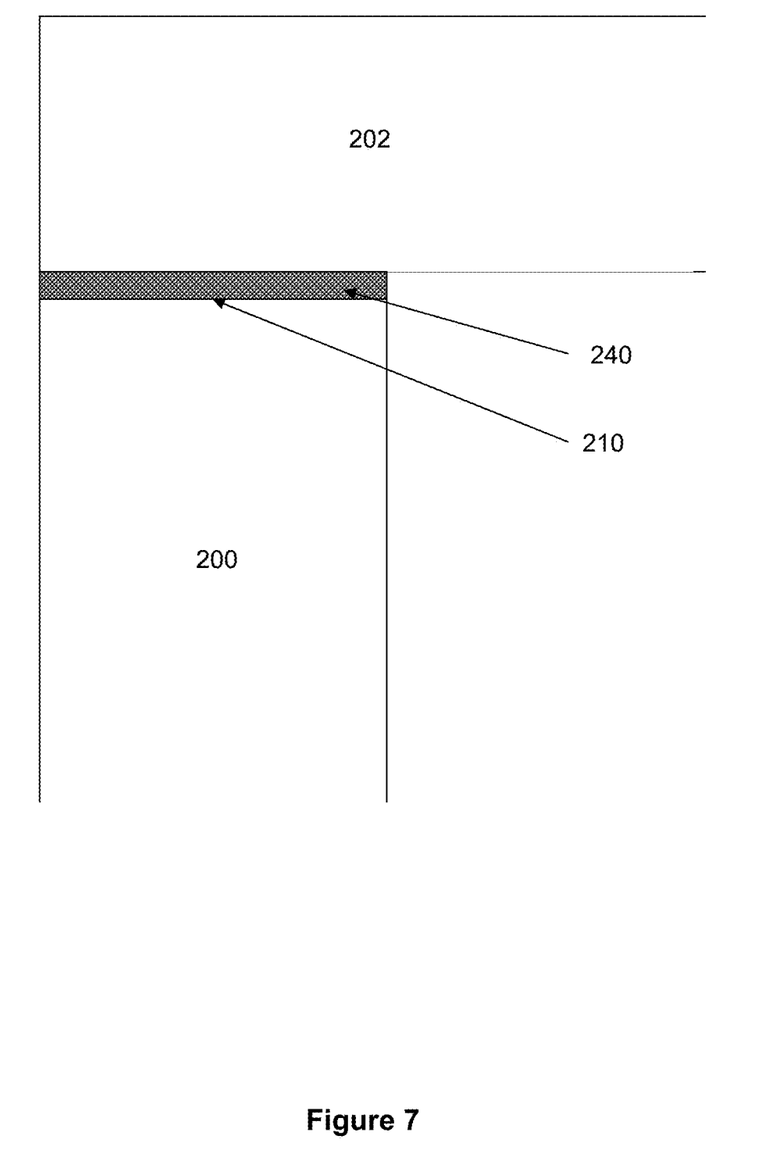
FIG. 7 is a schematic illustration which illustrates a third aspect of the method of FIG. 4.
Figure 8:
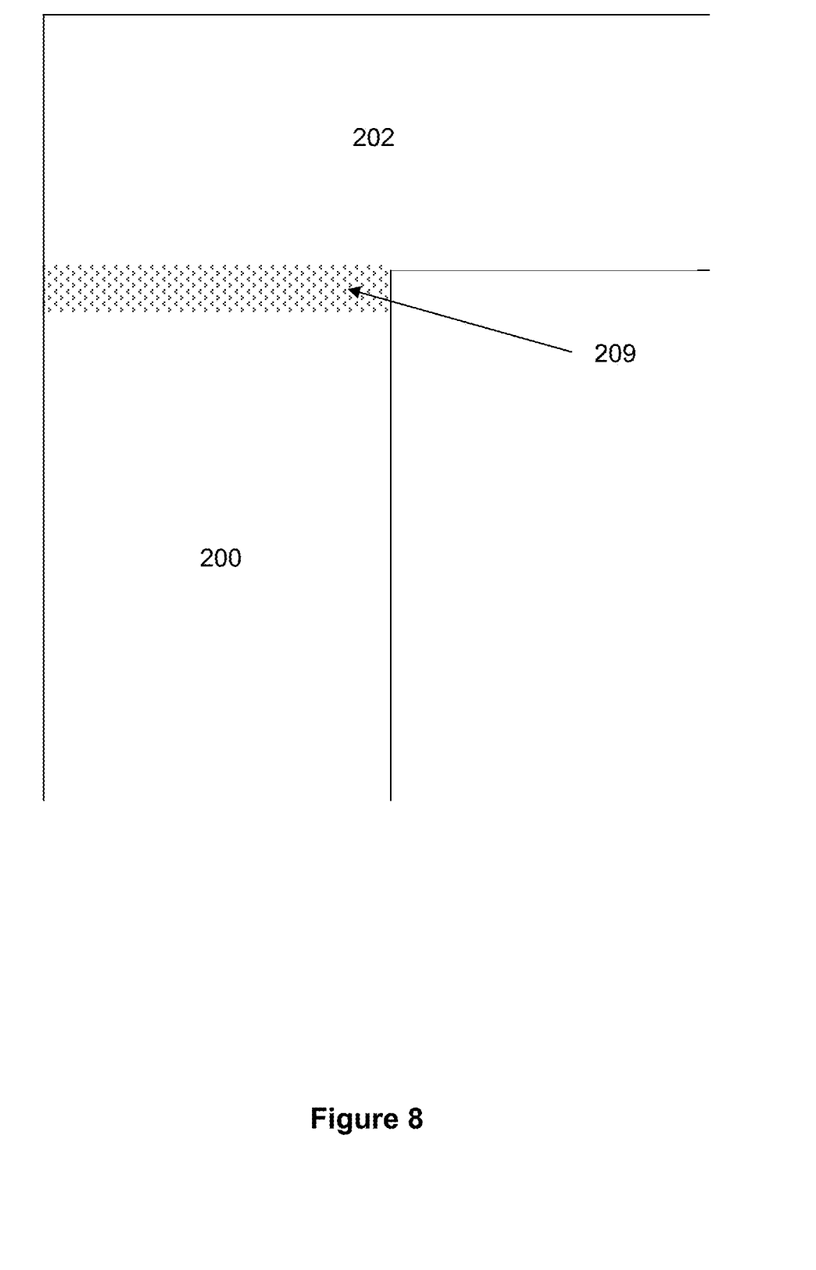
FIG. 8 is a schematic illustration which shows a joint formed between parts according to the present method.
Figure 9:
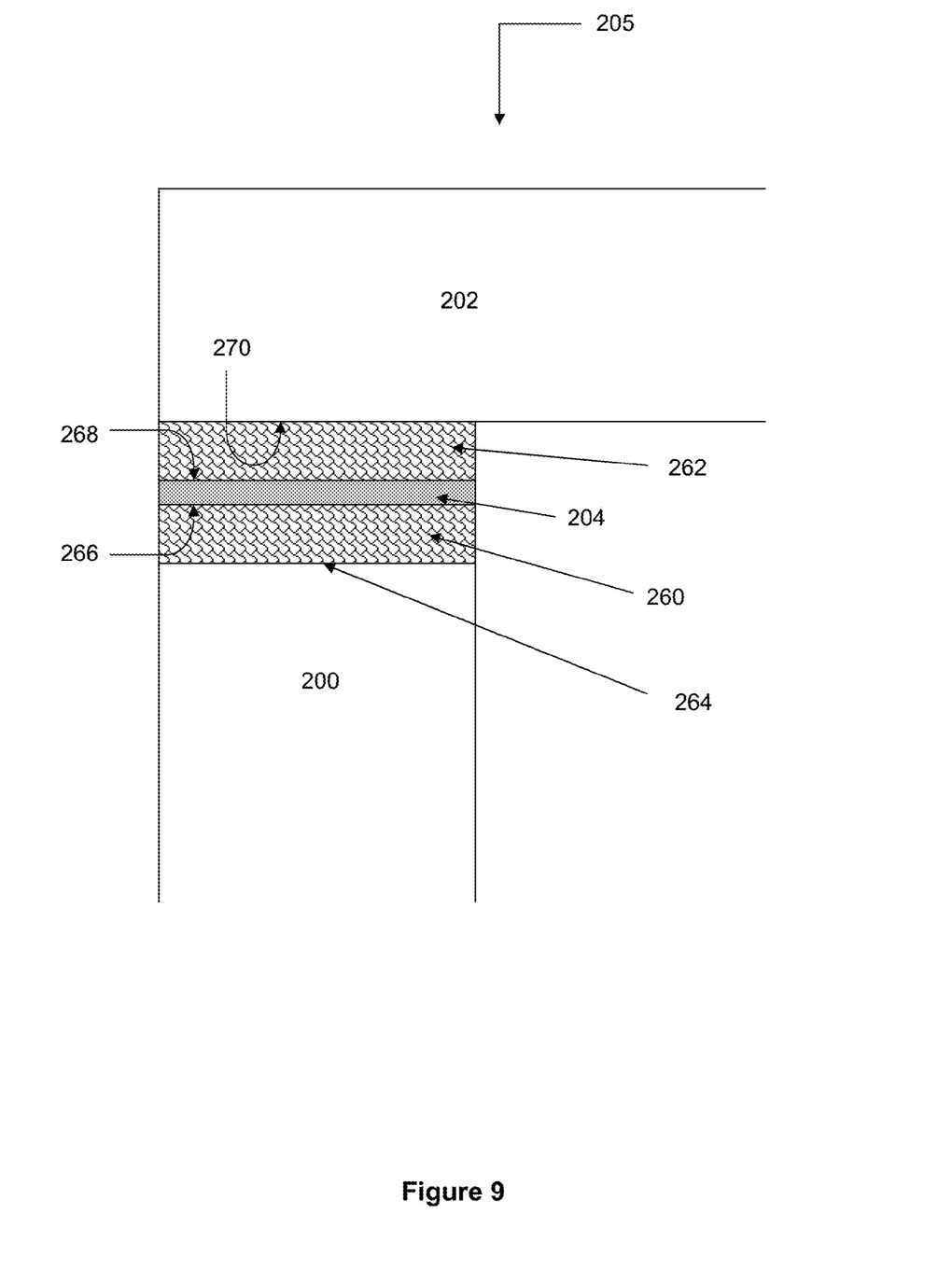
FIG. 9 is a schematic illustration of a further embodiment of the method of joining parts.

Referring to FIGS. 4-9, I disclose embodiments which relate to a method for joining parts that comprise aluminum oxide-containing material, such as sapphire or sapphire-clad parts. An example of a suitable material is single crystal sapphire. According to one example, a sapphire cladding tube 200 of a nuclear fuel element is joined to a sapphire end cap 202 in order to seal tube 200. A layer 204 of a joint forming compound such as aluminum nitride is provided between the sapphire surfaces of the respective parts 200 and 202 where these contact each other, whereby the aluminum nitride layer 204 is sandwiched between contacting portions of the end cap 202 and tube 200 when these are assembled. The joint forming layer is selected to react with aluminum oxide to form a monolithic joint on the application of heat. We refer to the "definitions" section above for a discussion of suitable joint-forming mixtures for use with the present invention. Furthermore, directional references herein, such as "upper" and "lower", refer to the respective parts stacked vertically for assembly, as shown in FIGS. 4 and 9.

Aluminum nitride layer 204 is initially provided on upper rim 210 of tube 200. Rim 210 is flat and smooth in order to prevent gaps. Preferably, layer 204 fully covers rim 210 but may alternatively cover only a portion thereof.

Figure 5:
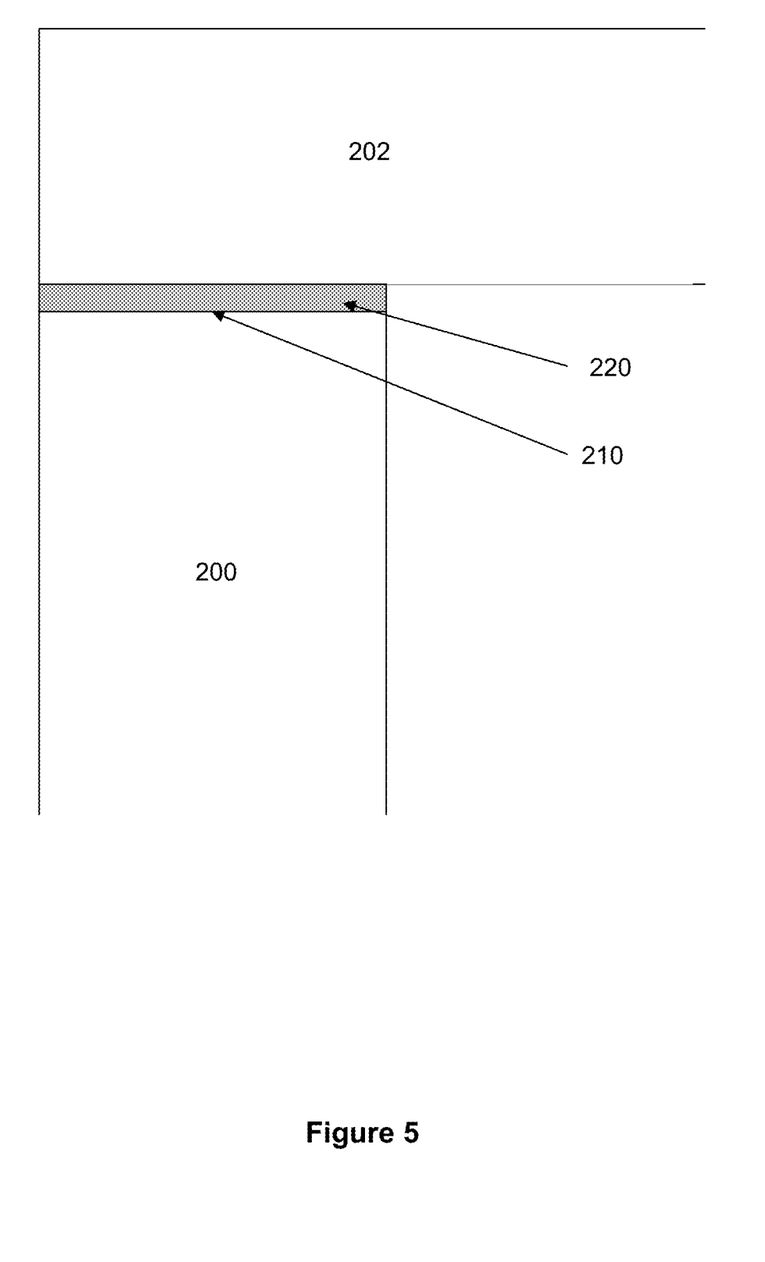
FIG. 5 is a schematic illustration which illustrates a first aspect of the method of FIG. 4.

The aluminum nitride layer 204 between parts 200 and 202 may be produced by any suitable means. Examples for providing layer 204 include the following:

EXAMPLE 1 (FIG. 5)

A thin wafer 220 of aluminum nitride is 'sandwiched' between the end cap 202 and rim 210 of tube 200. The wafer and adjoining sapphire surfaces should be flat and have a smooth finish typically 10 micro meter or better; the thickness of the wafer depends on the laser heating cycle to be applied. A thin wafer such as 0.1 millimeters is preferable when it is desired to localize the heating to the immediate surroundings of the joint area. Localized heating which selectively heats wafer 220 minimizes heat transfer to fuel pellets (not shown) within the cladding which may be desirable to avoid cracking of the fuel pellets closest to the joint.

Figure 6:
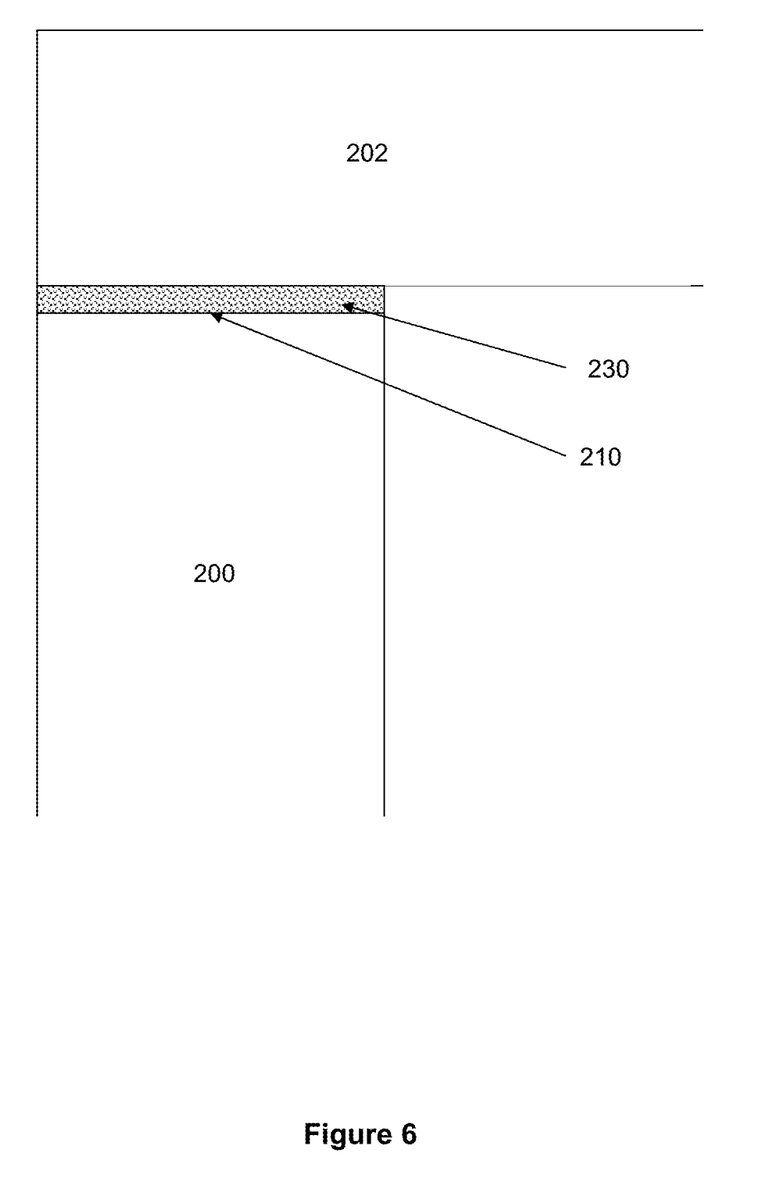
FIG. 6 is a schematic illustration which illustrates a second aspect of the method of FIG. 4.

EXAMPLE 2 (FIG. 6)

A fine powder 230 of aluminum nitride is tape cast on rim 210 using a non-aqueous binder. The tube 200 with tape casting is then heated in accordance with known methods for driving off the binder and consolidating the powder. Following tape casting, the aluminum nitride may be sintered to further consolidate the material. As with example 1, the thickness of the tape casting depends on the desired heating cycle with a thinner casting permitting a more localized heating during joint forming. The end cap 202 is then positioned on the end of the tube 200. The tape casting 230 could also be applied to the end cap 202 in addition to or instead of coating rim 210.

EXAMPLE 3 (FIG. 7)

A coating process such as physical vapor deposition or chemical vapor deposition is used to coat rim 210 with an aluminum nitride layer 240. As with the other methods for creating the interstitial layer, rim 210 and adjoining surface of the end cap 202 should be flat and smooth prior to the coating. This is particularly important for coating processes that only produce a thin coating layer. The coating 240 could also be applied to the end cap 202 in addition to or instead of coating the butt end of the tube.

An alternate joint forming layer comprises a layer aluminum nitride and aluminum oxide in a eutectic ratio in the aluminum oxide-aluminum nitride phase system abutting a layer of aluminum nitride. This compound layer may be either aluminum nitride on top of the eutectic ratio layer or the eutectic ratio layer sandwiched between a top and bottom aluminum nitride layer. The eutectic ratio layer maybe a phase of aluminum oxide and aluminum nitride or it may be a solid mixture of aluminum nitride and aluminum oxide powder in the composition ratio of the eutectic.

The above layer-forming methods may also be used to create the interstitial layers when a eutectic ratio mixture of aluminum oxide and aluminum nitride is added to the interstitial region between parts 200 and 202.

After the interstitial layer 204 is created using one of the above methods or other suitable method, end cap 202 is positioned on the end of tube 200 to form assembly 205. A clamping force is applied that is sufficient the maintain the interstitial layer 204 in intimate contact with the adjoining smooth sapphire surfaces throughout the laser heating process.

Following the above steps, selective heating is applied to layer 204 to react this layer with the regions of the tube 200 and cap 202 that are in contact therewith. The selective heating may be provided by directing a laser beam at layer 204. Since layer 204 is non-transparent (i.e. absorptive) of IR radiation when it is in the initial unreacted state, whilst the adjacent sapphire tube 200 and cap 202 are essentially transparent to IR radiation, layer 204 is selectively heated by the laser beam whilst the adjacent sapphire components are not directly heated by laser source 208. However, when layer 204 is heated, the sapphire parts that contact this layer become heated by conduction from layer 204. As such, the laser beam may be directed through one or both of parts 200 and 202 to impinge on layer 204 to provide localized (selective) heating of layer 204 followed by indirect heating of portions of parts 200 and 202 that are in contact with layer 204. It will be seen that this conductive heating occurs maximally within a relatively thin region of parts 200 and 202.

An example of a method to selectively heat layer 204 with a laser beam is described herein. Tube 200 is positioned in an upright orientation on a turntable 206 whereby its upper rim 210 faces upwardly. Parts 200 and 202 are assembled whereby layer 204 is sandwiched between parts 200 and 202. End cap 202 is positioned atop tube 200 in a vertically aligned orientation whereby rim 210 is fully covered by end cap 202.

A laser source 208 is provided and is oriented to direct a laser beam towards layer 204, at the region where tube 200 contacts end cap 202. For example, laser source 208 may be mounted in an overhead position to direct a laser beam downwardly through end cap 202, onto rim 210. The selective heating can be provided by directing a fixed-position laser beam from source 208 to the joint area between parts 200 and 202 while these are rotated on turntable 206. Laser source 208 is oriented such that the laser beam impinges momentarily on a given location 212 which consists of a relatively small portion of rim 210, as shown in FIG. 4. Most of the heat of the laser passes through the sapphire end cap 202 which is highly transparent to infrared radiation in the spectrum of the laser, ideally close to 1 micro meter wavelength, and impinges on the high emissivity aluminum nitride layer 204. As turntable 206 rotates, the laser impinges on the entirety of layer 204 during each full rotation. This results in localized, selective heating of the aluminum nitride layer 204.

As used herein, the term "selective heating" refers to heating targeted solely to layer 204 whilst the adjacent parts 200 and 202 are not directly heated by laser 208. In the present example, this is achieved by directing a laser beam through one or both of parts 200 and 202, which are essentially transparent to the laser spectrum, with the laser beam contacting layer 204, which is largely opaque to the IR spectrum and thus absorptive of the laser beam when unreacted.

As layer 204 is selectively heated, it in turn transmits heat into adjacent layers of parts 200 and 202 in the joint region, thereby indirectly heating these adjacent layers.

With each rotation of tube 200 there is a successively greater heat deposition in the joint area. While heat is being deposited by the laser it is also being conducted away from the joint by thermal conduction into the cladding tube 200 and end cap disk 202, where these contact layer 204. The attainment of the joint forming temperature requires a laser heat flux sufficient to more than offset the loss of heat from the joint region by conduction.

The laser heating cycle depends on the thickness of the interstitial layer, with a thicker layer requiring more heating. An example of a heating cycle for a 11.5 millimeter external diameter tube with a 0.35 millimeter wall thickness and a 0.02 millimeter thick aluminum nitride layer heated by a 0.4 millimeter beam diameter 50 Watt maximum beam power Nd:YAG laser follows.

According to one aspect, the aluminum nitride layer 204 is heated to the melting temperature of the adjacent sapphire parts or slightly above this level. This procedure can be advantageous in that it requires a relatively short time where a short duration heating cycle is needed to avoid heat-up of adjacent fuel, exceeding the melting temperature will be necessary. According to another example, layer 204 is heated to a temperature which is below the melting temperature of the adjacent sapphire parts, but is sufficiently high to react the respective compounds of the sapphire parts and layer 204. Heat is transmitted by conduction into adjacent portions of parts 200 and 202, thereby raising the temperature resulting in diffusion mixing and a reaction with layer 204 to join the parts together with a monolithic joint.

As discussed below, according to one example, the reaction between layer 204 with the sapphire of parts 200 and 202 may form a eutectic mixture of the compounds. This is achieved by heating layer 204 to the eutectic point of the aluminum oxide/aluminum nitride eutectic system. When heated to this temperature for sufficient duration, heat is then conducted into the adjacent sapphire whereupon the respective compounds react to form a eutectic mixture. The resulting region 209 of eutectically mixed compounds effectively forms a monolithic joint between parts 200 and 202.

The laser is set-up so that the mid-point of the beam impinges normally on the mid-point of the tube thickness. The tube is rotated at a speed of 500 revolutions per minute cap and interstitial layer in position and clamped. Constant laser power is applied for a heat-up to 2080 C in approximately 10 seconds. The power is then reduced to hold the temperature between 2000 and 2080 C. As the aluminum nitride reacts and is incorporated into aluminum oxy-nitride compounds 250 in the joint region the infrared transparency of the joint will increase. The laser power will increasingly pass through the joint. When this condition is detected the laser will be reduced to zero allowing the joint to cool down.

Layer 204 is heated by this means to a temperature which exceeds the temperature of the eutectic points of the AlON—Al2O3 section of the AlN—Al2O3 system, 1800 C to 2050 C, namely 1800 C to 2150 C. In this temperature range, heat conducted from layer 204 into the adjacent parts 200 and 202 causes a layer of the sapphire of the respective parts 200 and 202 to diffuse and react with the aluminum nitride of layer 204. The reacted portions of parts 200 and 202, together with layer 204, form a layer 209 comprising a aluminum oxide and aluminum oxy-nitride compounds that, on cooling, joins parts 200 and 202. Layer 209 extends partially into both of parts 200 and 202.

The heating step consists of three stages. An initial stage 1 consists of a "ramp up" in which laser heating is applied at a sufficient strength to cause layer 204 to reach a temperature which is lightly above the eutectic points in the AlON—Al$_2$O$_3$ section of the ALN—Al$_2$O$_3$ phase diagram. During this stage, layer 204 conducts heat into adjacent portions parts 200 and 202, raising their temperature.

This first stage is followed by a "holding" stage 2, at which laser heating is applied at a reduced strength that is sufficient to maintain the temperature of stage 1 for a duration sufficient to cause the reaction described herein between layer 204 and the adjacent sapphire layers to form an aluminum oxy-nitride compound.

This is then followed by a cooling stage 3, during which a laser strength reduced from stage 2 may be applied, or the laser source may be switched off. During this cooling stage, layers 200 and 202 chemically bond with a monolithic joint 209 across the border region between these layers, which consists of a layer of aluminum oxide and aluminum oxy-nitride compounds that extends partway into the respective parts 200 and 202. This monolithic joint 209 is schematically shown in FIG. 8.

According to one aspect, shown in FIG. 4, a detector 215 is provided and is configured to detect any portion of the laser beam that is transmitted through layer 204, to measure the progress of the joint forming reaction that consumes the non-transparent aluminum nitride. For example, detector 215 may comprise a calorimetric detector. Detector 215 may be linked to a controller (not shown) which controls the operation of laser 208. When layer 204 is unreacted, prior to and during the initial part of stage 1 heating, it absorbs essentially all of the laser beam directed thereon and detector 215 registers essentially no laser power passing through layer 204. As layer 204 is heated and caused to react with the abutting sapphire, it increases in transparency, which then is detected by detector 215. When layer 204 is then fully reacted with the adjacent sapphire, this is detected by detector 215 as a maximal light transmissivity through layer 204 that exceeds a second predetermined threshold. At this point, a signal is sent to laser 208 to implement stage 3.

According to a further embodiment, schematically shown in FIG. 9, additional layers 260 and 262 are applied between parts 200 and/or 202. Layer 260 is a lower layer that underlies aluminum nitride layer 204 and layer 262 is an upper layer that overlies layer 204, thereby sandwiching layer 204 between them. Layers 260 and 262 each comprise a eutectic mixture of aluminum nitride and aluminum oxide. Layers 204, 260 and 262 may all be applied to either one of parts 200 and 202 by one of the methods described above, or some of these layers may be applied to one of parts 200 and the rest of these layers applied to part 202. Assembly 205 of the above components comprises a first (lowermost) interface 264 between lower part 200 and lower layer 260, a second interface 266 between layers 260 and 204, a third interface 268 between layers 204 and 262 and a fourth (uppermost) interface 270 between layer 262 and upper part 202.

In this example, assembly 205 is exposed to IR radiation from a laser beam, in the same manner as the previous embodiment. Since parts 200 and 202, as well as layers 260 and 262, are all IR-transparent, the laser beam passes through these layers to be absorbed by aluminum nitride layer 204. Layer 204 is thus locally heated by laser 208. Heat deposited in layer 204 is then conducted through interfaces 266 and 268 into the underlying and overlying eutectic layers 260 and 262. When the eutectic layers 260 and 262 are heated, these in turn conduct heat through interfaces 264 and 270 into the lower and upper sapphire parts 200 and 202 respectively. Eutectic layers 260 and 262, having a lower melting point than any of the respective non-eutectic compounds of 200, 202 and 204, will melt before these respective components. As heat is applied from source 208, thereby heating layer 204, layers 260 and 262 become secondarily heated to the point at which they react with both the aluminum nitride layer 204 at interfaces 266 and 268 and also with sapphire parts 200 and 262 at interfaces 264 and 270. The respective reactions cause the sapphire of part 202 to enter into a eutectic mixture with layers 260 and 262. As this reaction proceeds, aluminum nitride layer 204 also reacts to form a eutectic with layers 260 and 262, thereby bridging sapphire parts 200 and 202 through the respective interfaces. These reactions generate a region between parts 200 and 202 comprising a eutectic mixture that bridges these parts with a monolithic joint. When the aluminum nitride layer 204 is fully reacted, it becomes transparent to IR radiation from source 208. As a result, the eutectic region will cool and solidify, forming the monolithic joint.

It will be seen that in the above embodiment, a single eutectic layer 260 or 262 may be provided rather than both of such layers.

The joining of a cylindrical cladding tube 200 to a disk shaped end cap 202 of a nuclear fuel element can thus be accomplished by a fixed laser beam directed to the joint area while the cladding tube is rotated such that the beam impinges momentarily on a given location as shown in FIG. 4. Most of the heat of the laser passes through the sapphire end cap which is mostly transparent to infrared radiation in the spectrum of the laser and impinges on the high emissivity aluminum nitride layer resulting in localized heating of the aluminum nitride and adjacent materials in the joint region. With each rotation of the cladding tube the there is a successively greater heat deposition in the joint area. While heat is being deposited by the laser it is also being conducted away from the joint by thermal conduction into the cladding tube and end cap disk, where these contact the aluminum nitride layer.

The attainment of the joint forming temperature requires a laser heat flux sufficient to more than offset the loss of heat from the joint by conduction.

It is to be kept in mind that the foregoing descriptions of specific embodiments and modifications thereto, and attached Figures, are presented by way of example only and should not be construed as limiting the inventive concept to any particular physical configuration or process. It is to be clearly understood that the scope of the present invention is limited only by the appended claims.

The invention claimed is:

1. A method of forming a joint between parts, wherein the parts comprise sapphire, the parts comprising respective surfaces configured for mutual contact, at least one of the parts further comprising a layer of aluminum nitride thereon whereby the aluminum nitride layer is juxtaposed between the surfaces when the parts are brought into contact, the method comprising bringing the parts into contact whereby the aluminum nitride layer is sandwiched between the surfaces of the respective parts, and providing localized heating of the aluminum nitride layer from a heat source that does not directly heat the parts, to at least the melting temperature of the juxtaposed surfaces of the parts, such that the aluminum nitride melts adjacent sapphire of the parts and reacts with the melted sapphire to form aluminum oxy-nitride compounds that, on cooling, join the parts.

2. The method of claim 1 wherein prior to making the joint, at least one of the sapphire parts is subjected to fine forming by thermal creep.

3. The method of claim 2 wherein said thermal creep fine forming comprises the steps of heating a rough sapphire part to about 1700-2000° C. following by passing the part through a die.

4. The method of claim 2 wherein said thermal creep fine forming comprises the steps of placing a rough sapphire part in a mold, wherein the mold has a lower thermal coefficient of expansion than sapphire, heating the part and mold to about 1700-2000° C. and removing the part from the mold.

5. The method of claim 1 wherein the step of providing a layer of aluminum nitride comprises coating a surface of at least one of the sapphire parts with aluminum nitride.

6. The method of claim 1 wherein the step of localized heating comprises directing a beam from the heat source, comprising infrared spectrum radiation, through at least one of the sapphire parts, wherein the sapphire parts are essentially transparent to the laser beam.

7. The method of claim 6 comprising the further step of detecting infrared radiation passing through the aluminum nitride layer and reducing the intensity of the infrared radiation when there is detected an increase in the infrared radiation passing through the aluminum nitride layer that exceeds a predetermined threshold.

8. The method of claim 6 wherein said beam comprises a laser beam.

9. The method of claim 1 wherein the parts comprise components of a nuclear reactor.

10. The method of claim 8 wherein said parts comprise components of a nuclear fuel element.

11. The method of claim 1 wherein the sapphire comprises single crystal sapphire.

12. The method of claim 1 wherein the layer of aluminum nitride comprises a wafer having a maximum thickness of about 0.1 millimeters.

13. The method of claim 1 further comprising the step of forming the layer of aluminum nitride by adhering aluminum nitride powder onto the surface of one or both of the parts.

14. The method of claim 1 further comprising the step of forming the layer of aluminum nitride by vapor deposition with aluminum nitride onto one or both of the parts.

15. A sapphire component fabricated by the method of claim 1.

16. The component of claim 13 comprising a component of a nuclear reactor.

17. The component of claim 14 wherein the component is a part of a nuclear fuel element.

18. A method of forming a joint between parts, wherein at least one of the parts comprises aluminum oxide, the parts comprising respective surfaces configured for mutual contact, at least one of the parts further comprising a layer thereon comprising aluminum nitride, the method comprising bringing the parts into contact whereby the aluminum nitride layer is sandwiched between the surfaces of the respective parts, and selectively heating the aluminum nitride layer to a temperature sufficient to react the aluminum nitride layer with the aluminum oxide of at least one of said parts to form a mixture of aluminum oxide and aluminum oxy-nitride compounds that, on cooling, joins the parts, wherein the selective heating comprises exposing the layer to a heat source that does not directly heat the parts.

19. The method of claim 18 wherein the parts are essentially transparent to a selected wavelength range of infrared radiation and the aluminum nitride layer absorbs the infrared radiation when unreacted, wherein the heating comprises exposing the aluminum nitride layer to infrared radiation from the heat source within the selected range whereby the infrared radiation passes through at least one of the parts.

20. The method of claim 19 comprising the further step of detecting infrared radiation passing through the aluminum nitride layer and reducing the intensity of the infrared radiation when there is detected an increase in the infrared radiation passing through the aluminum nitride layer that exceeds a predetermined threshold, indicative of said reaction occurring.

21. The method of claim 19 wherein the infrared radiation comprises a laser beam.

22. The method of claim 18 wherein the reaction forms a eutectic ratio mixture of aluminum nitride and aluminum oxide.

23. The method of claim 18 where the parts comprise sapphire.

24. The method of claim 18 wherein the layer of aluminum nitride comprises a solid wafer.

25. The method of claim 18 further comprising the step of forming the layer of aluminum nitride by adhering aluminum nitride powder onto the surface of one or both of the parts.

26. The method of claim 18 further comprising the step of forming the layer of aluminum nitride by vapor deposition with aluminum nitride onto one or both of the parts.

27. The method of claim 18 comprising the further step of applying a second layer between the parts, the second layer comprising a eutectic mixture of aluminum oxide and aluminum nitride, wherein the selective heating of the aluminum nitride layer indirectly heats the second layer and reacts the second layer with the aluminum oxide of at least one of the parts.

28. The method of claim 27 comprising the further step of providing a third layer between the parts, comprising a eutectic mixture of aluminum oxide and aluminum nitride, wherein the aluminum nitride layer is sandwiched between the second and third layers.

* * * * *